United States Patent
Hsu

(10) Patent No.: US 8,474,924 B2
(45) Date of Patent: *Jul. 2, 2013

(54) RAIL DEVICE AND SERVER

(75) Inventor: Yung-Chin Hsu, Taipei (TW)

(73) Assignee: Inventec Corporation, Taipei (TW)

( * ) Notice: Subject to any disclaimer, the term of this patent is extended or adjusted under 35 U.S.C. 154(b) by 524 days.

This patent is subject to a terminal disclaimer.

(21) Appl. No.: 12/727,446

(22) Filed: Mar. 19, 2010

(65) Prior Publication Data

US 2011/0100934 A1    May 5, 2011

(30) Foreign Application Priority Data

Nov. 3, 2009   (TW) .............................. 98137321 A

(51) Int. Cl.
- A47B 95/00    (2006.01)
- A47F 7/00    (2006.01)
- A47B 88/00    (2006.01)

(52) U.S. Cl.
USPC ........................... 312/333; 211/26; 312/334.8

(58) Field of Classification Search
USPC ............ 211/26, 126.15, 151, 162; 312/334.8, 312/334.44, 334.46, 334.7, 334.47, 334.1, 312/334.4, 334.27, 334.5, 334.16, 334.32, 312/334.6, 333; 384/21
See application file for complete search history.

(56) References Cited

U.S. PATENT DOCUMENTS

| | | | |
|---|---|---|---|
| 2,295,697 A * | 9/1942 | Sulentic .................... | 312/334.8 |
| 4,440,461 A * | 4/1984 | Powell et al. .............. | 312/334.8 |
| 4,872,734 A * | 10/1989 | Rechberg ................... | 312/333 |
| 5,492,400 A * | 2/1996 | Rock ........................... | 312/331 |
| 5,564,807 A * | 10/1996 | Rock et al. ................. | 312/331 |
| 5,626,406 A * | 5/1997 | Schmid ..................... | 312/334.28 |
| 6,036,288 A * | 3/2000 | Shih .......................... | 312/223.3 |
| 6,988,626 B2 * | 1/2006 | Varghese et al. ............ | 211/26 |
| 7,744,176 B2 * | 6/2010 | Milligan .................. | 312/334.32 |
| 7,780,254 B2 * | 8/2010 | Wang et al. ............... | 312/334.7 |
| 2002/0158556 A1 * | 10/2002 | Cheng ......................... | 312/333 |
| 2003/0209958 A1 * | 11/2003 | Hwang et al. ........... | 312/334.46 |
| 2005/0116595 A1 * | 6/2005 | Milligan .................. | 312/334.46 |
| 2008/0143226 A1 * | 6/2008 | Huang et al. ............... | 312/334.8 |
| 2008/0157643 A1 * | 7/2008 | Chen .......................... | 312/334.6 |
| 2010/0033926 A1 * | 2/2010 | Du et al. .................. | 361/679.58 |
| 2010/0089853 A1 * | 4/2010 | Wang et al. .................. | 211/183 |
| 2010/0264792 A1 * | 10/2010 | Chang ......................... | 312/294 |
| 2011/0100935 A1 * | 5/2011 | Yang .............................. | 211/26 |
| 2011/0100936 A1 * | 5/2011 | Chang et al. .................... | 211/26 |

* cited by examiner

*Primary Examiner* — Joshua J Michener
*Assistant Examiner* — Patrick Hawn
(74) *Attorney, Agent, or Firm* — J.C. Patents

(57) ABSTRACT

A rail device and a server are provided. The server includes a rack, at least one chassis, and a rail device. The rail device is disposed on the rack and the chassis that the chassis moves between a first position and a second position relative to the rack. The rail device includes a first rail, a second rail, a bracket, a driver, and a first latch. The first rail on the rack has an actuator, a first stopper, and a second stopper. The bracket has two ends slidably disposed at the first and the second rails individually. The driver is slidably disposed on the bracket. The first latch disposed on the chassis latches and pushes the driver forward when the chassis moves away from the first position. The first and the second stoppers then block movement of the driver and the bracket that the chassis moves to the second position.

4 Claims, 7 Drawing Sheets

RAIL DEVICE AND SERVER

CROSS-REFERENCE TO RELATED APPLICATION

This application claims the priority benefit of Taiwan application serial no. 98137321, filed on Nov. 3, 2009. The entirety of the above-mentioned patent application is hereby incorporated by reference herein and made a part of this specification.

BACKGROUND OF THE INVENTION

1. Field of the Invention

The invention relates to a rail device. More particularly, the invention relates to a rail device applicable to a server.

2. Description of Related Art

Currently, an industrial server allows a user to control operation of peripheral equipment or machines. In the server, a chassis having two side walls is utilized, a bottom of the chassis is connected between the two side walls, and an accommodation space capable of accommodating hardware equipment including a power source, various circuit boards, and a disk array is formed between the two side walls. After the hardware equipment including the power source, the circuit boards, and the disk array is disposed in the chassis, the chassis must be placed in a chassis cabinet for the user to control operation of the peripheral equipment.

The aforesaid chassis is disposed on a fixed-type L-shaped rack in the chassis cabinet. Given that the hardware equipment within the chassis is damaged or needs to be expanded, the chassis must be disassembled from the L-shaped rack, and the hardware equipment in the chassis can then be repaired or expanded. After the repair or expansion is done, the chassis must be assembled back to the L-shaped rack in the chassis cabinet, which creates inconvenience to maintenance and expansion of the hardware equipment.

Accordingly, some manufacturers modify the L-shaped rack to make retractable rails. When the hardware equipment in the chassis is damaged or needs to be expanded, the chassis can be directly pulled out from the chassis cabinet, and the hardware equipment in the chassis can then be repaired or expanded. After the repair or expansion of the hardware equipment in the chassis is done, the chassis is pushed back to the chassis cabinet, and the maintenance or expansion of the hardware equipment is completed.

Although the aforesaid rail facilitates the maintenance or expansion of the hardware equipment in the chassis, said rail occupies internal space of the chassis cabinet, i.e. internal space in the chassis cabinet is reduced, such that installation of the hardware equipment in the chassis cannot go smoothly, or that expandability of the server is adversely affected because less hardware equipment can be installed in the chassis.

SUMMARY OF THE INVENTION

The invention is directed to a rail device with a new structure.

The invention is further directed to a server having a movable chassis with relatively large accommodation space.

In an embodiment of the invention, a rail device adapted to a server is provided. The server includes a rack and at least one chassis. The rail device is disposed on the chassis and the rack that the chassis being moved between a first position and a second position relative to the rack. The rail device includes a first rail, a second rail, a bracket, a driver, and a first latch. The first rail is disposed on the rack. Besides, the first rail has an actuator, a first stopper, and a second stopper. The second rail is disposed in the chassis. The bracket has a first end and a second end. The first end is slidably disposed at the first rail, while the second end is slidably disposed at the second rail. The driver is slidably disposed on the bracket. The first latch is disposed on the chassis. When the chassis moves away from the first position, the first latch latches and pushes the driver forward. Next, the actuator drives the first latch to unlatch the driver, the first stopper blocks movement of the driver, and the second stopper blocks movement of the bracket, such that the chassis moves to the second position along the bracket.

In an embodiment of the invention, a server including a rack, at least one chassis, and a rail device is provided. The rail device is disposed on the rack and the chassis that the chassis being moved between a first position and a second position relative to the rack. The rail device includes a first rail, a second rail, a bracket, a driver, and a first latch. The first rail is disposed on the rack. The first rail has an actuator, a first stopper, and a second stopper. The second rail is disposed in the chassis. The bracket has a first end and a second end. The first end is slidably disposed at the first rail, while the second end is slidably disposed at the second rail. The driver is slidably disposed on the bracket. The first latch is disposed on the chassis. When the chassis moves away from the first position, the first latch latches and pushes the driver forward. Next, the actuator drives the first latch to unlatch the driver, the first stopper blocks movement of the driver, and the second stopper blocks movement of the bracket, such that the chassis moves to the second position along the bracket.

According to an embodiment of the invention, the driver interferes with the bracket. When the chassis moves away from the first position to the second position, the first latch pushes the driver forward, and the driver moves the bracket relative to the first rail.

According to an embodiment of the invention, the rail device further includes a second latch disposed on the chassis. When the chassis is at the second position, the second latch latches the bracket to fix the chassis onto the bracket.

According to an embodiment of the invention, the bracket includes a slide block and a supporter. The slide block is slidably disposed at the first rail. The supporter is mounted onto the slide block and slidably disposed at the second rail, and the driver is slidably disposed on the supporter.

According to an embodiment of the invention, the second rail and the chassis are integrally formed.

Based on the above, the second rail is disposed within the chassis according to the embodiments of the invention, such that more space in the chassis is available. Besides, by arrangement of the driver and the bracket, the chassis of the server can remain horizontal after the chassis is pulled out from the rack. Thereby, more usable space in the server is available, and usage or maintenance of the server is far more effortless.

It is to be understood that both the foregoing general descriptions and the following detailed embodiments are exemplary and are, together with the accompanying drawings, intended to provide further explanation of technical features and advantages of the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
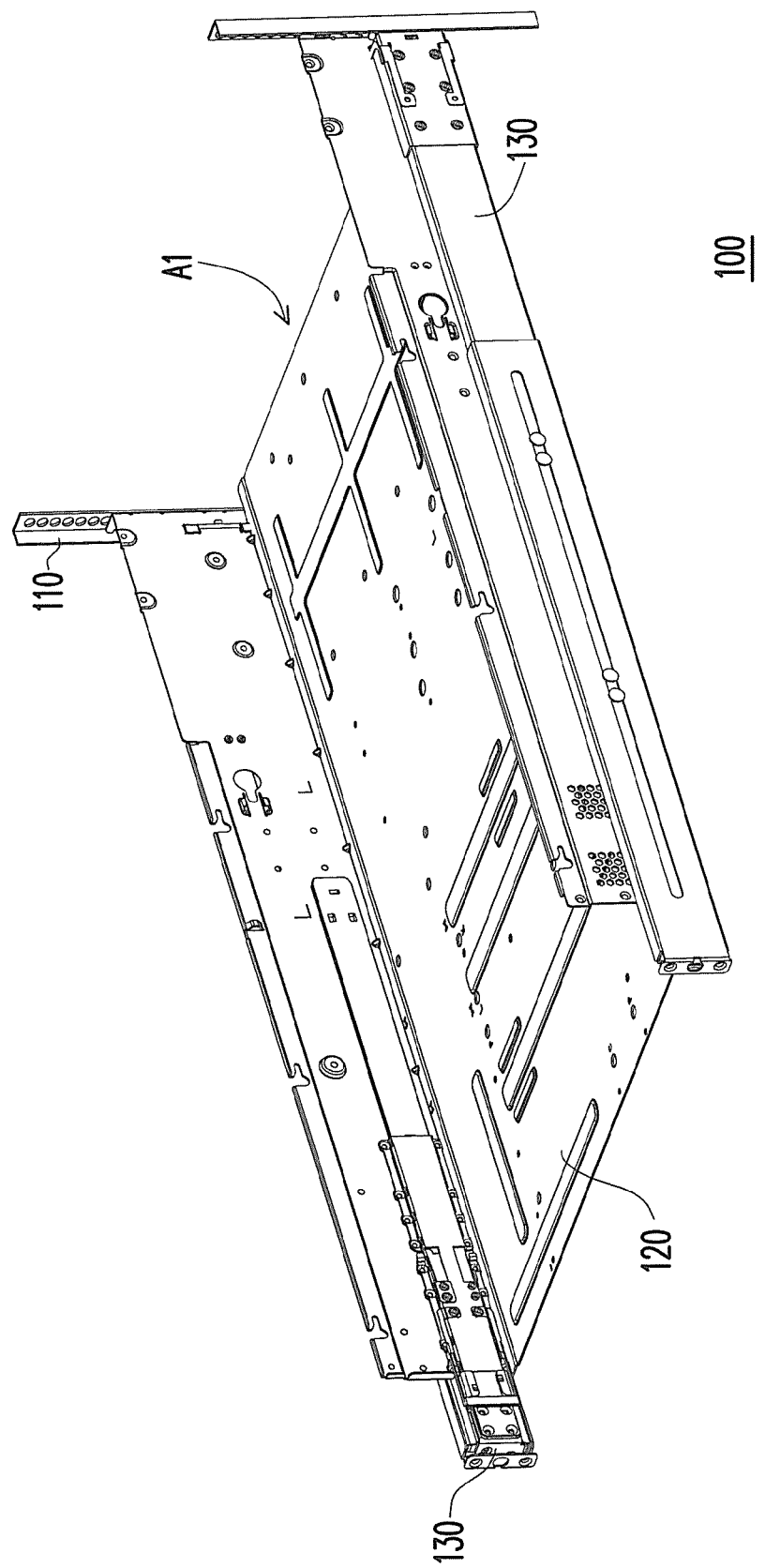
FIGS. 1 and 2 are schematic views illustrating a server according to an embodiment of the invention.
Figure 2:
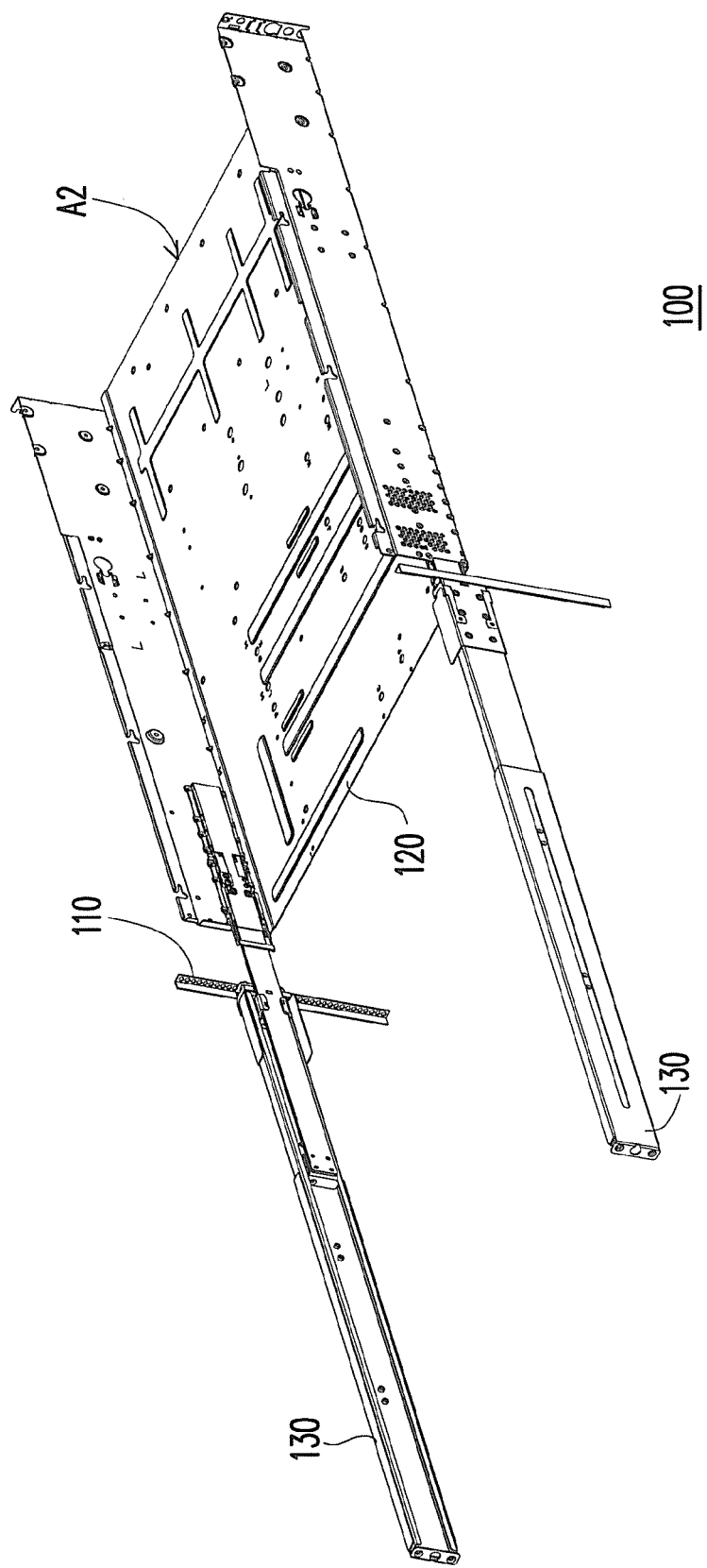

FIGS. 1 and 2 are schematic views illustrating a server according to an embodiment of the invention. FIG. 1 shows that a chassis of a server is at a first position, while FIG. 2 shows that the chassis of the server is at a second position. With reference to FIGS. 1 and 2, the server 100 includes a rack 110, at least one chassis 120, and a rail device 130. The rail device 130 is disposed on the rack 110 and the chassis 120 that the chassis 120 being moved between a first position A1 in FIG. 1 and a second position A2 in FIG. 2 relative to the rack 110.

Figure 3:
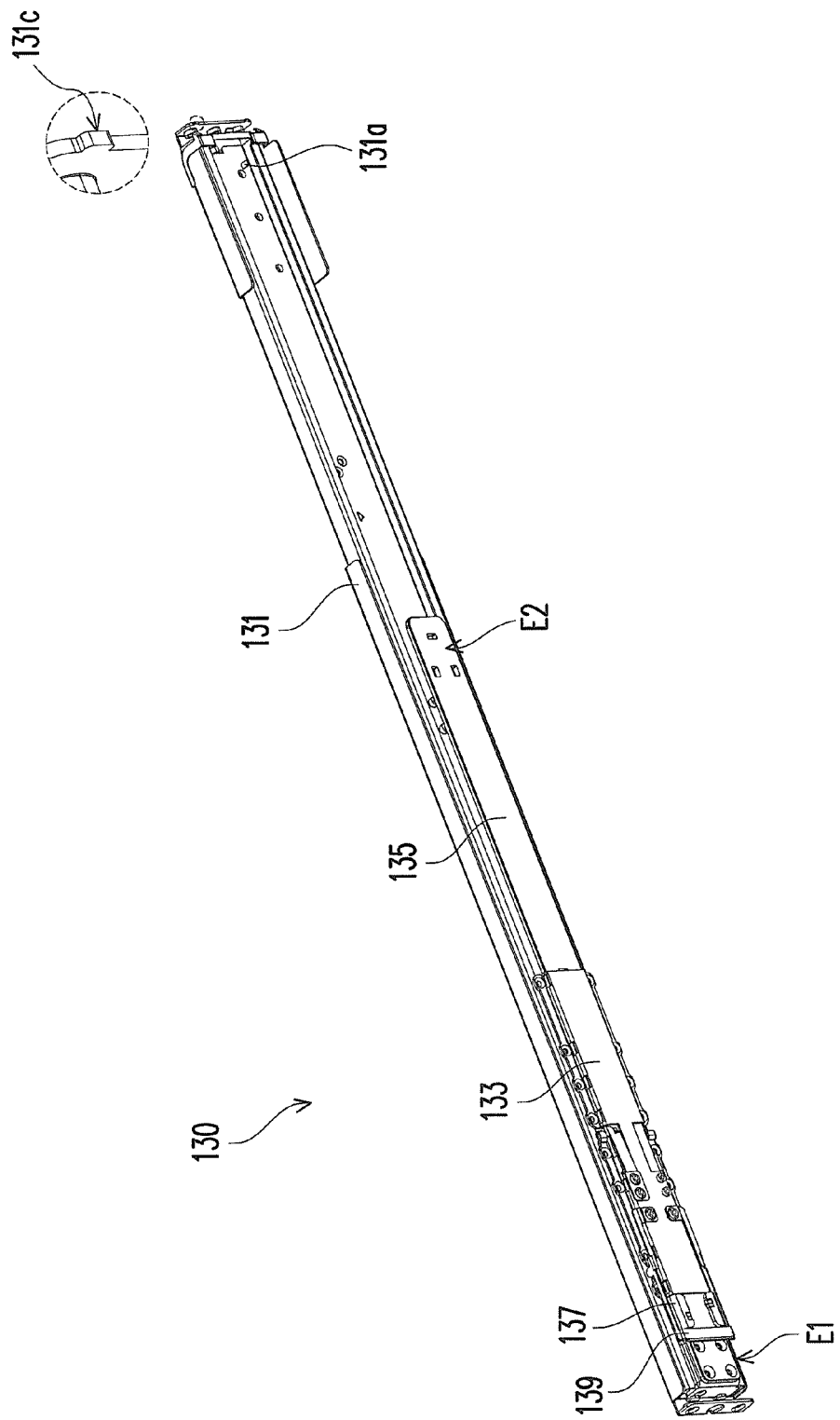
FIG. 3 is a schematic view illustrating partial components of the server depicted in FIG. 1.

FIG. 3 is a schematic view illustrating partial components of the server depicted in FIG. 1. In this embodiment, the chassis 120 is omitted, so as to clearly show components that correlate with the rail device 130. As indicated in FIGS. 1 to 3, even though rails in the rail device 130 are disposed in pairs at respective sides of the chassis 120, only the rails at one side are described herein. In this embodiment, the rail device 130 includes a first rail 131, a second rail 133, a bracket 135, a driver 137, and a first latch 139.

Figure 4:
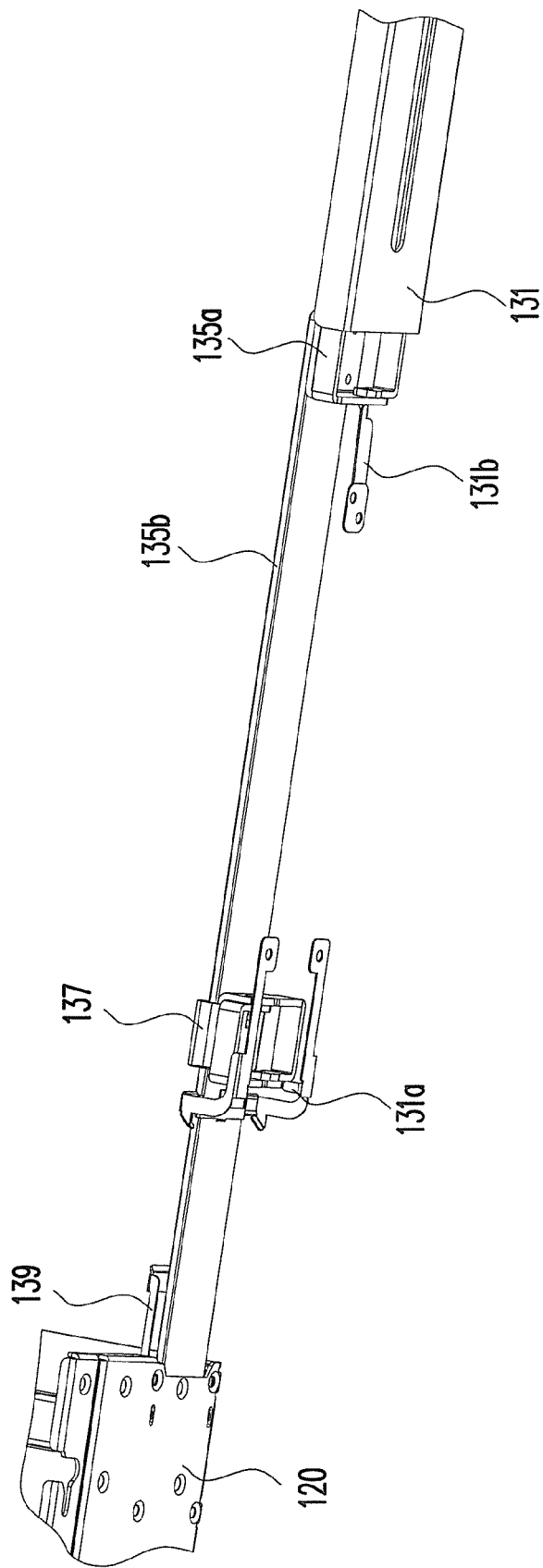
FIGS. 4 and 5 are schematic views sequentially illustrating movement of the chassis of FIG. 1 away from a first position.
Figure 5:
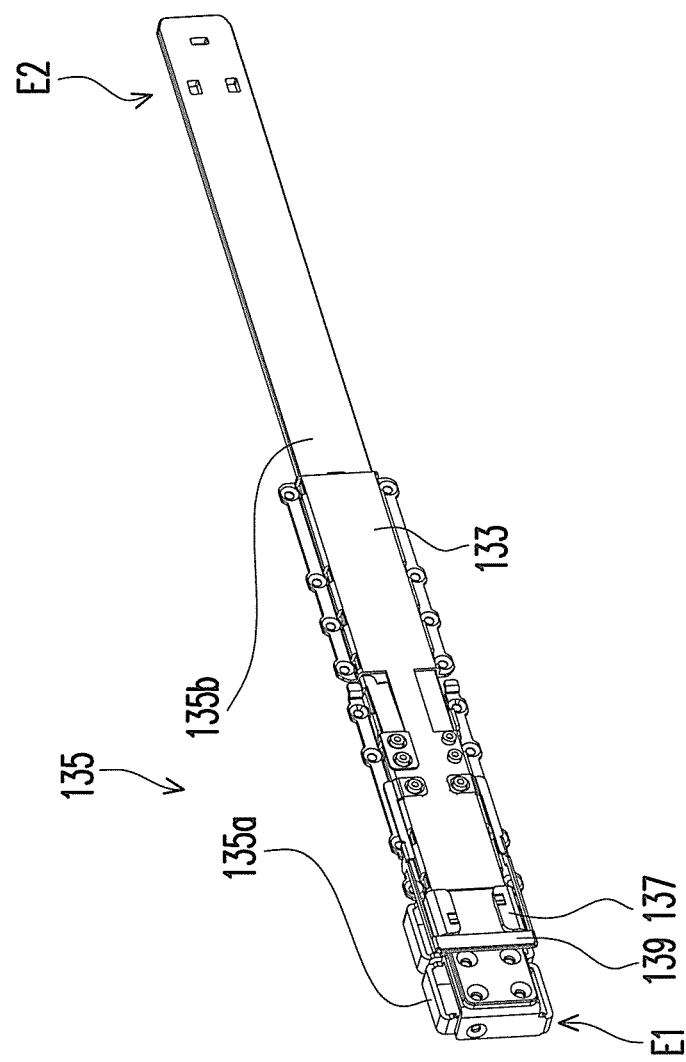

FIGS. 4 and 5 are schematic views sequentially illustrating movement of the chassis of FIG. 1 away from a first position. With reference to FIGS. 3 to 5, the first rail 131 is disposed on the rack 110 (shown in FIG. 2), while the second rail 133 is disposed in the chassis 120. The first rail 131 has a first stopper 131a, a second stopper 131b, and an actuator 131c. The bracket 135 has a first end E1 and a second end E2. The first end E1 is slidably disposed at the first rail 131, while the second end E2 is slidably disposed at the second rail 133. The first latch 139 is disposed on the chassis 120. When the chassis 120 moves away from the first position A1 in FIG. 1, the first latch 139 latches and pushes the driver 137 forward. Next, the actuator 131c drives the first latch 139 to unlatch the driver 137, the first stopper 131a blocks movement of the driver 137, and the second stopper 131b blocks movement of the bracket 135, such that the chassis 120 moves to the second position A2 in FIG. 2 along the bracket 135.

Based on the above, the second rail 133 is disposed in the chassis 120 according to this invention, such that the chassis 120 of the server 100 can move relative to the rack 110 and can have large accommodation space. Namely, the chassis 120 of this invention has advantages of both a movable chassis and a fixed-type chassis. Additionally, in the rail device 130 of the invention, the chassis 120 pulled out from the rack 110 remains horizontal because the chassis 120 is supported by the driver 137 and the bracket 135. Thereby, a user is apt to dispose or repair components in the chassis 120.

Further, as indicated in FIGS. 1 and 3, the second rail 133 and the chassis 120 are integrally formed in this embodiment. That is to say, during fabrication of the chassis 120, a plate can be bent and riveted to the chassis 120 to form the second rail 133, so as to simplify fabrication and reduce costs.

Figure 6:
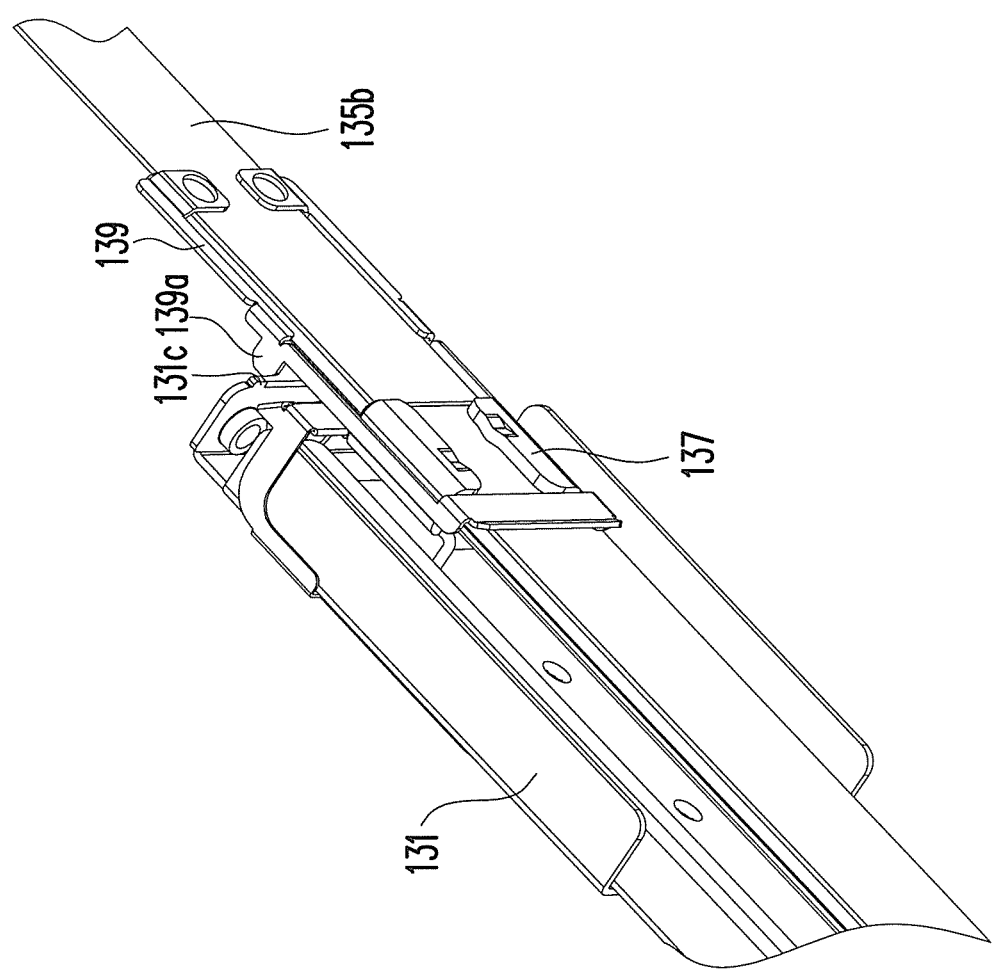
FIG. 6 is a schematic view illustrating the bracket depicted in FIG. 3.

FIG. 6 is a schematic view illustrating the bracket depicted in FIG. 3. With reference to FIGS. 3 and 6, the bracket 135 includes a slide block 135a and a supporter 135b. The supporter 135b is mounted onto the slide block 135a, and the driver 137 is slidably disposed on the supporter 135b. In this embodiment, the slide block 135a has the first end E1, and the supporter 135b has the second end E2. In other words, the slide block 135a is slidably disposed at the first rail 131, and the supporter 135b is slidably disposed at the second rail 133.

Note that the driver 137 interferes with the bracket 135b. Therefore, when the first latch 139 on the chassis 120 latches and moves the driver 137, the chassis 120 drives the bracket 135 to move because of a friction force generated by the driver 137 and the supporter 135b. Meanwhile, the slide block 135a is slid at the first rail 131.

Besides, in FIGS. 3 and 4, according to this embodiment, the first latch 139 is made by a metal plate, and the first latch 139 is mounted onto the chassis 120 and interferes with the driver 137. When the chassis 120 moves away from the first position A1 in FIG. 1, the actuator 131c at the first rail 131 presses a protrusion 139a of the first latch 139, and the first latch 139 unlatches the driver 137 because of metallic flexibility of the first latch 139. It should be mentioned that external configurations of the actuator 131c and the first latch 139 are not limited in this embodiment. Namely, this embodiment is applicable as long as the first latch 139 can unlatch the driver 137 after the chassis 120 moves away from the first position A1.

Please refer to FIGS. 2, 4, and 5. When the actuator 131c at the first rail 131 unlocks the first latch 139, the first stopper 131a and the second stopper 131b respectively block the driver 137 and the slide block 135a, such that the driver 137 and the slide block 135a stay at the first rail 131. At this time, the chassis 120 moves along the supporter 135b to the second position A2 through the second rail 133. Here, the chassis 120 is completely hung out of the rack 110. By arrangement of the driver 137, the slide block 135a at the first rail 131, and the supporter 135b connecting the first rail 131 and the second rail 133, the chassis 120 remains horizontal.

Figure 7:
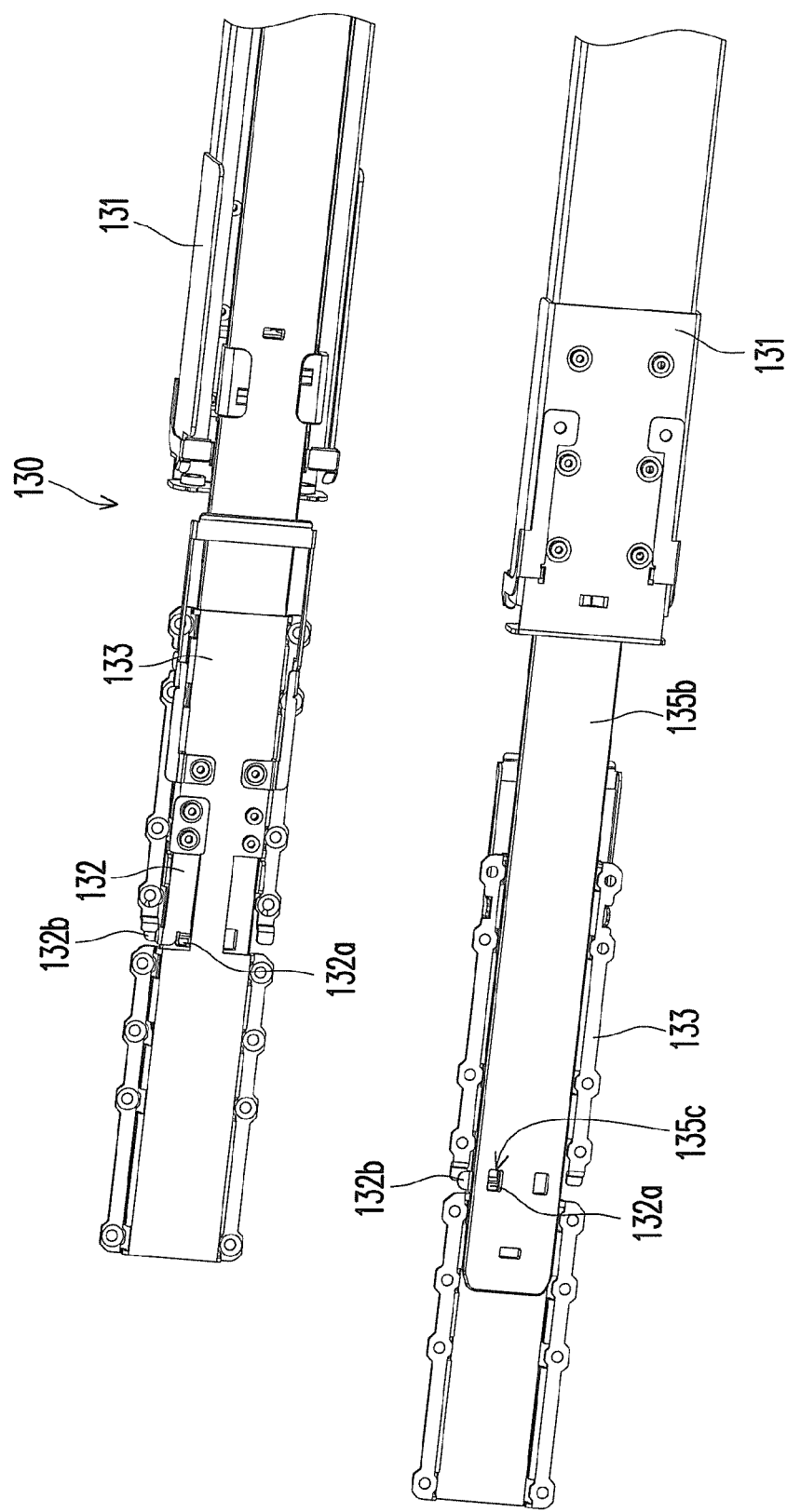
FIG. 7 is a schematic view illustrating partial components of the server depicted in FIG. 2 at another view angle.

FIG. 7 is a schematic view illustrating partial components of the server depicted in FIG. 2 at another view angle. The first rail and the chassis are omitted in FIG. 7 to clearly show the bracket and the second rail. With reference to FIGS. 2 and 7, the rail device 130 further includes a second latch 132 of which a side is mounted onto the chassis 120. The second latch 132 is, for example, a metal fastener having a pressing portion 132b and a buckling portion 132a. When the chassis 120 moves away from the first position A1 to the second position A2, the buckling portion 132a is fastened onto an opening 135c of the supporter 135b. Thereby, the chassis 120 can be fixed onto the supporter 135b to prevent the chassis 120 from falling down from the rail device 130. When the chassis 120 is to be removed from the rail device 130, the pressing portion 132b of the second latch 132 is pressed and moved away from the opening 135c, such that the chassis 120 can be removed from the rail device 130.

In light of the foregoing, the rails of the invention are categorized into the first rail disposed on the rack and the second rail disposed in the chassis, such that the server is equipped with the movable chassis having relatively large accommodation space. Moreover, by arrangement of the driver and the bracket, the chassis that is pulled out from the rack can be securely supported by the bracket and can remain horizontal. As such, the server having the rail device of the invention features expansibility and convenient usage or maintenance.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A server, comprising:
   a rack;
   at least one chassis;
   a rail device disposed on the rack and the chassis such that the chassis is moved between a first position and a second position relative to the rack, the rail device comprising:
   a first rail disposed on the rack, the first rail having an actuator, a first stopper, and a second stopper;
   a second rail disposed in the chassis;
   a bracket having a first end and a second end, the first end being slidably disposed at the first rail, the second end being slidably disposed at the second rail;
   a driver slidably disposed on the bracket; and
   a first latch disposed on the chassis, wherein the first latch latches and engages the driver at the first position, the first latch pushes the driver forward when the chassis moves away from the first position, when the first latch arrives at a position corresponding to the actuator, the actuator drives the first latch to unlatch the driver, the first stopper blocks movement of the driver, and the second stopper blocks movement of the bracket, such that the chassis moves to the second position along the bracket, wherein the bracket further comprises a slide block and a supporter, the slide block is slidably disposed at the first rail, the supporter is mounted onto the slide block and slidably disposed at the second rail, and the driver is slidably disposed on the supporter.

2. The server as claimed in claim 1, wherein the driver interferes with the bracket, the first latch pushes the driver forward, and the driver moves the bracket relative to the first rail when the chassis moves from the first position to the second position.

3. The server as claimed in claim 1, the rail device further comprising a second latch disposed on the chassis, the second latch latching the bracket when the chassis is at the second position, so as to fix the chassis onto the bracket.

4. The server as claimed in claim 1, wherein the second rail and the chassis are integrally formed.

* * * * *